US006775808B1

(12) United States Patent
Raje et al.

(10) Patent No.: US 6,775,808 B1
(45) Date of Patent: Aug. 10, 2004

(54) METHOD AND APPARATUS FOR GENERATING SIGN-OFF PROTOTYPES FOR THE DESIGN AND FABRICATION OF INTEGRATED CIRCUITS

(75) Inventors: Salil R. Raje, San Jose, CA (US); Lawrence T. Pileggi, Pittsburgh, PA (US); Dinesh D. Gaitonde, San Mateo, CA (US); Olivier R. Coudert, Sunnyvale, CA (US); Padmini Gopalakrishnan, Sunnyvale, CA (US); Jackson David Kreiter, Sunnyvale, CA (US)

(73) Assignee: Monterey Design Systems, Inc., Sunnyvale, CA (US)

( * ) Notice: Subject to any disclaimer, the term of this patent is extended or adjusted under 35 U.S.C. 154(b) by 93 days.

(21) Appl. No.: 09/632,494

(22) Filed: Aug. 3, 2000

(51) Int. Cl.[7] .............................................. G06F 17/50
(52) U.S. Cl. ..................................... 716/4; 716/5; 716/6
(58) Field of Search ............................... 716/12–14, 18, 716/1–11; 700/121

(56) References Cited

U.S. PATENT DOCUMENTS

| 4,484,292 | A | * | 11/1984 | Hong et al. ..................... 716/13 |
| 5,495,419 | A | * | 2/1996 | Rostoker et al. ............. 700/121 |
| 5,544,071 | A | * | 8/1996 | Keren et al. ..................... 716/6 |
| 5,867,399 | A | * | 2/1999 | Rostoker et al. ............... 716/18 |
| 5,953,236 | A | * | 9/1999 | Hossain et al. .................. 716/6 |
| 6,230,304 | B1 | * | 5/2001 | Groeneveld et al. ............ 716/7 |
| 6,286,128 | B1 | * | 9/2001 | Pileggi et al. .................. 716/18 |
| 6,415,426 | B1 | * | 7/2002 | Chang et al. .................... 716/9 |
| 6,557,145 | B2 | * | 4/2003 | Boyle et al. ..................... 716/2 |

OTHER PUBLICATIONS

Togawa et al. "Maple–opt: a simultaneous technology mapping, placement, and global routing algorithm for FPGAs", proceedings of the ASP–DAC '95/CHDL '95/VLSI '95, IFIP international Conference on Hardware Description Languag, Aug. 1995, pp. 554–559.*

Pedram et al. "Layout driven logic restructuring/decomposition", Digest of Technical Papers, 1991 IEEE International Conference on Computer–Aided Design, Nov. 11, 1991, pp. 134–137.*

Kleinhans et al., "Gordian: VLSI Placement by Quadratic Programming and Slicing Optimization", IEEE Transactions on Computer Aided Design, vol. 10, No. 3, Mar. 1991, pp. 356–365.*

* cited by examiner

Primary Examiner—Vuthe Siek
Assistant Examiner—Naum Levin
(74) Attorney, Agent, or Firm—Vierra Magen Marcus Harmon & DeNiro LLP

(57) ABSTRACT

Methods and apparatus for a physical "sign-off" prototype tool that includes a prototype tool that generates a physical prototype for a design and a optimization tool that provides a designer with the option to further optimize the physical prototype before signing off on the design. In either situation, the "sign-off" prototype provides a forward prediction of the area, timing and performance of the final GDS of the design generated by a physical implementation tool.

34 Claims, 8 Drawing Sheets

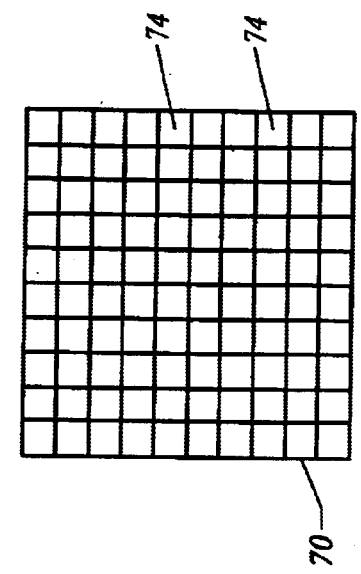
FIG. 4A
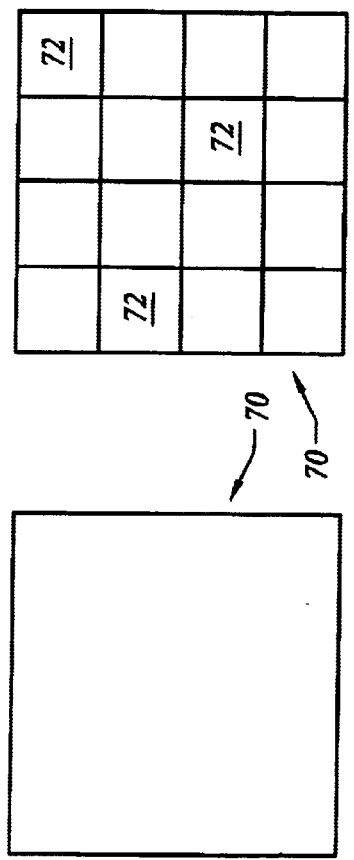
FIG. 4B
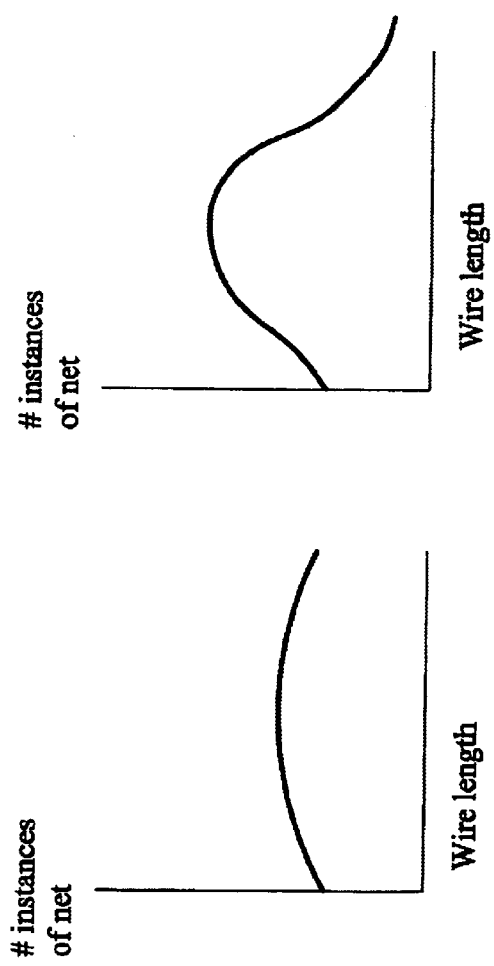
FIG. 4C
FIG. 5A
FIG. 5B
FIG. 5C

METHOD AND APPARATUS FOR GENERATING SIGN-OFF PROTOTYPES FOR THE DESIGN AND FABRICATION OF INTEGRATED CIRCUITS

BACKGROUND OF THE INVENTION

1. Field of Invention

The present invention relates generally to electronic design automation (EDA) tools for designing integrated circuits, and more particularly, the present invention relates to a physical "sign-off" prototype tool that includes a prototype tool that generates a physical prototype for a design and a optimization tool that provides a designer with the option to further optimize the physical prototype before signing off on the design.

2. Description of the Related Art

The use of electronic design automation (EDA) tools has become commonplace for the design of high density integrated circuits. The current design flow used by most integrated circuit design engineers includes the sequential steps of: defining a Register Transfer Level (RTL) description of the circuit; performing logic synthesis which converts the RTL description into a gate level design. The logic synthesis process typically involves several phases. Initially the logic synthesis tool parses and compiles the RTL description into logic equations. Next the logic equations are optimized (i.e., simplified). Finally a gate level net list is generated from the synthesized logic by mapping the logic equations into a gate level design using the cell library, area, power and speed constraints for the process that will be used to fabricate the device; laying out the major functional blocks of the circuit from the net list using a floor planner tool; placing the cells that make up each of the major functional blocks in the circuit using a placement tool; routing the requisite interconnect between the major functional blocks and within the cells using a routing tool; determining the resistive-capacitive delays along all of the interconnect wires using an extraction tool; and performing timing analysis to estimate delays through the cells (transistors) and the propagation delays along each interconnect path (wire) to determine any clock or other timing problems. Based on this analysis, the designer can update or optimize the RTL, synthesis, net list, floor plan, placement and/or routing of the design to correct any problems. A designer will typically perform numerous iterations of the above-defined sequential flow until timing, congestion, and other problems are identified and corrected. When the design has been debugged, then a mask set is generated so the circuit can be fabricated.

The availability of deep sub-micron (0.25 micron and below) processes has enabled high density, system-on-a-chip, designs containing millions and millions of logic gates and transistors that provide rich functionality and high performance. Deep sub-micron processes, however, also pose a problem for design engineers. Optimizing timing is critical for correct operation and high performance, but accurate modeling and estimation of timing for deep sub-micron designs is difficult. A timing value, such as the delay of a critical path, is a function of both the transistors in the cells and the wires that form the interconnect. The delay characteristics of the transistors are specified in the cell library. The delay characteristics of the wires, such as resistance, inductance, and coupling capacitance, are determined by the wire length and other details of the physical design, which is produced by the floor planner, placement, and routing tools. In the current sequential design flow, when the logic synthesis tool attempts to optimize a timing value, the delay through the transistors is available from the cell library, but since the physical design has not been completed (or even started), only crude estimates of the wire lengths and none of the details are available to estimate the delay through the wires. This was not a problem with earlier processes, since the delay of the transistors was the dominant component of timing values and errors in estimating the delay of the wires could be ignored. However, with deep sub-micron processes, interconnect can be the dominant component of timing values, so accurate modeling and estimation is essential. As process technologies advance and designs become ever more complex, creating working, high density circuits running at higher and higher clock rates will become an ever more daunting task for integrated circuit designers.

Current EDA tools are inadequate for deep sub-micron designs. Previous logic synthesis tools are problematic because they generate net lists without sufficient physical layout information. Since wire delays account for such a large proportion of the total delays with deep sub-micron designs, these logic synthesis tools invariably generate sub-optimal net lists. Consequently designers using these tools are often required to perform numerous iterations of the above-defined design sequence, each consuming potentially many weeks or more, before timing problems created from using sub-optimal net lists can be corrected. Since designers usually are under tremendous pressure to complete designs and to quickly bring product to market, these tools are less than adequate in today's competitive environment. Furthermore since these tools are used sequentially and cannot be used simultaneously to resolve problems, some designs may never reach closure.

Therefore a physical "sign-off prototype" tool that includes a prototype tool that generates a physical prototype for a design and a optimization tool that provides a designer with the option to further optimize the physical prototype before signing off on the design is needed.

SUMMARY OF THE INVENTION

The present invention relates to a physical "sign-off" prototype tool that includes a prototype tool that generates a physical prototype for a design and a optimization tool that provides a designer with the option to further optimize the physical prototype before signing off on the design. In either situation, the "sign-off" prototype provides a forward prediction of the area, timing and performance of the final GDS of the design generated by a physical implementation tool. These and other features of the present invention will become apparent upon reading the following detailed descriptions and studying the various figures of the drawings.

BRIEF DESCRIPTION OF THE DRAWINGS

The invention may best be understood by reference to the following description taken in conjunction with the accompanying drawings in which:

FIGS. 4A–4C are diagrams of an integrated circuit quadrisectioned into bins according to the present invention.

FIGS. 5A∫5C are a series of wire length profiles for the bins shown in FIGS. 4A–4C according to the present invention.

DETAILED DESCRIPTION OF THE INVENTION

Figure 1:
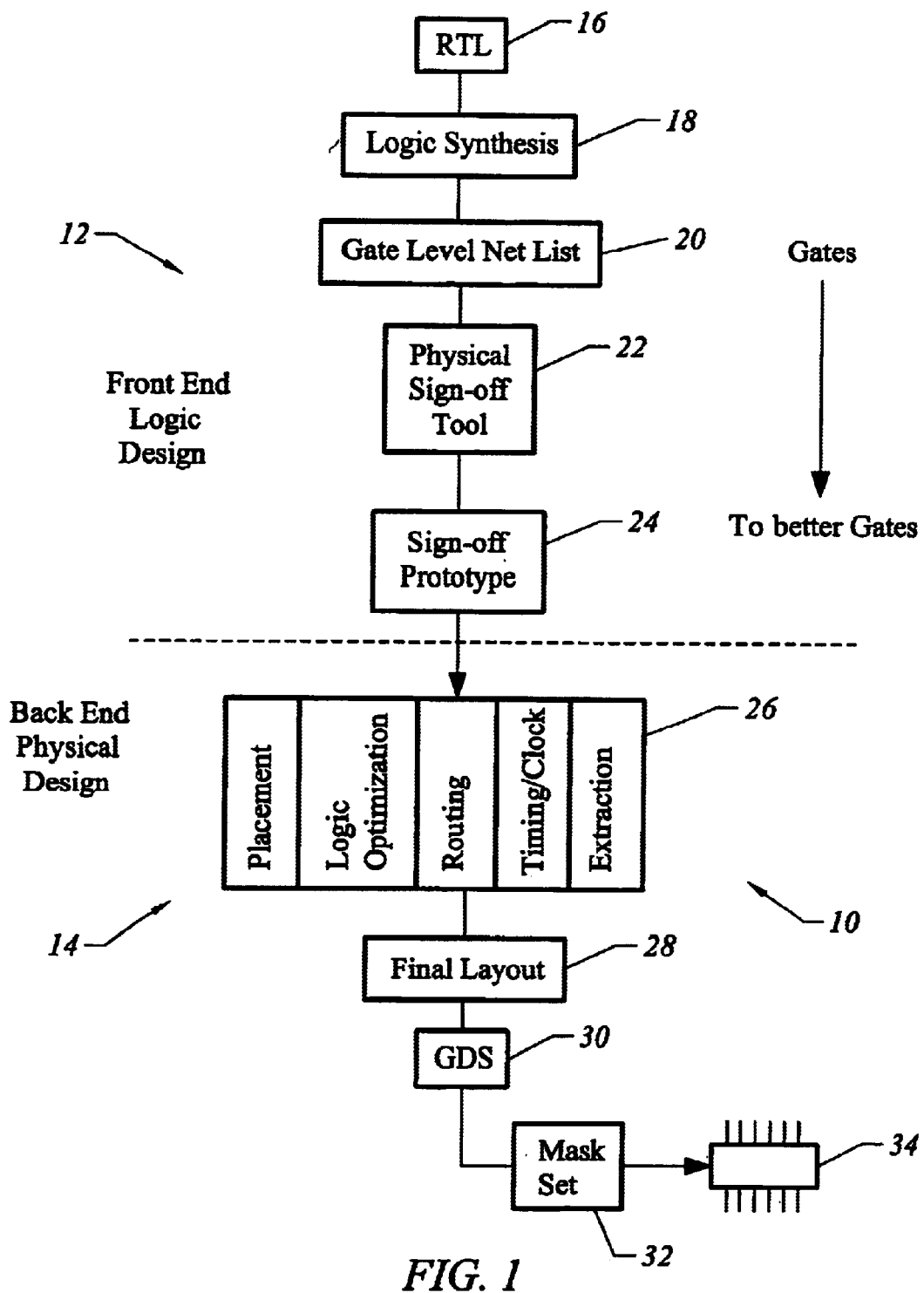
FIG. 1 is a diagram illustrating the design sequence of an integrated circuit according to the present invention.

Referring to FIG. 1, a diagram illustrating the design sequence of an integrated circuit is shown. The diagram 10 includes a front-end logic design stage 12 and a back-end physical design stage 14. The front-end logic design stage 12 includes the steps of defining an RTL description 16 of the circuit, performing logic synthesis 18 to convert the RTL description into a gate level net list 20. A physical sign-off tool 22 is then used to generate a sign-off prototype 24. Once the sign-off prototype 24 has been generated, it is provided to the back-end physical design stage 14. The back-end physical design stage 14 includes a physical design tool 26 that converts the sign-off prototype 24 into a physical layout. The physical design tool 26 performs the physical layout by iteratively performing the tasks of placement, logic optimization, routing, timing/clock control, and extraction in parallel. As placement progresses, routing models are refined and the accuracy of the congestion analysis and timing estimates become more accurate with each iteration. Eventually the cross talk and delay of all the wire interconnects in the design can be predicted. Since each of these tasks are performed simultaneously and each has the ability to communicate with the other, final placement and routing can quickly converge in terms of timing, power and clocking for the layout of the integrated circuit. For more details on the physical design tool 26, see co-pending commonly assigned U.S. patent application Ser. No. 09/021,973 entitled "Performance Driven Design Optimization Using Logical and Physical Information", filed Feb. 11, 1998 and incorporated by reference herein for all purposes. Once the design has converged, the designer signs off on the final layout 28 and a GDS file 30 is generated. With the GDS, the design of the integrated circuit is complete and the GDS is used to create a mask set 32 so the integrated circuit 34 can be fabricated. In an alternative embodiment, the physical sign-off tool 22 includes the logic synthesis step 18.

Figure 2:
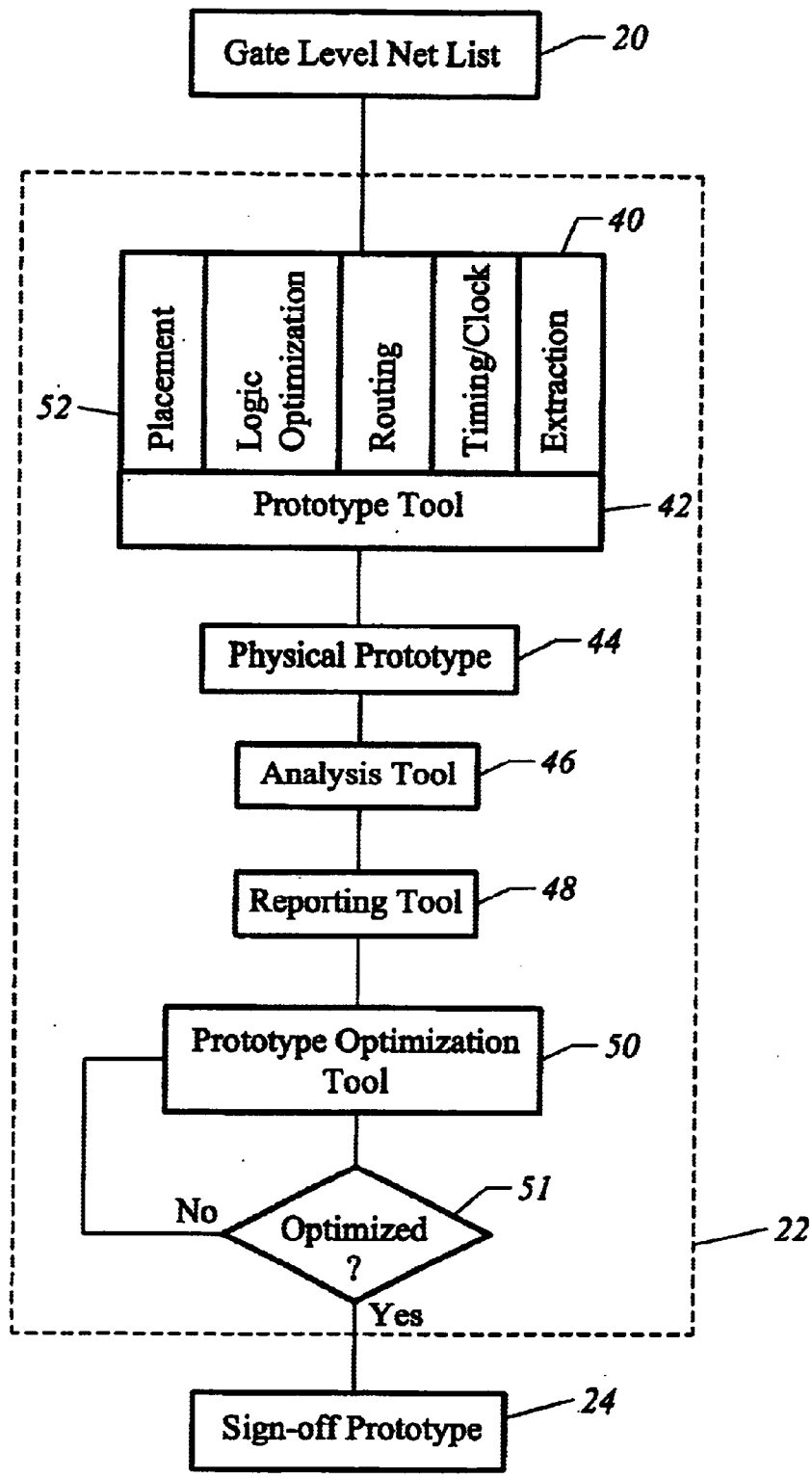
FIG. 2 is a diagram of a physical sign-off tool of the present invention.

Referring to FIG. 2, a diagram of the physical sign-off tool 22 is shown. The physical sign-off tool 22 includes a logic design tool 40 and a prototype tool 42. Together the logic design tool 40 and the prototype tool 42 generate from the gate level net list 20 a physical prototype 44 of the design, which is derived by: (i) defining a physical design of a circuit defined by the net list 20 by performing area and timing estimates of the design, and (ii) determining a physical placement level of the circuit when an error of a timing value (caused by errors in the prediction of wire lengths or other details of the physical. design) satisfies a predetermined threshold. Once the prototype 44 is defined, an analysis tool 46 analyzes the congestion, timing, power signal integrity, and other parameters of the circuit design. A reporting tool 48 generates a report detailing these parameters. Based on the report, a prototype optimization tool 50 enables the logic designer to perform additional optimization on the prototype 44. At the decision element 51, the designer determines if the prototype 44 is optimized or requires further optimization. If necessary or desirable, the prototype 44 can be optimized with one or more iterations using prototype optimization tool 50 to generate the sign-off prototype 24. Otherwise the prototype 44 becomes sign-off prototype 24 if no optimization is needed. In an alternative embodiment, the physical sign-off tool 22 reads the RTL description 16 of the circuit and includes a logic synthesis tool 18 to convert the RTL description into a gate level netlist 20.

The logic design tool 40 includes substantially the same set of tools including placement, logic optimization, routing timing/clock analysis and extraction as the physical design tool 26. Since the logic design tool 40 and the physical design tool 26 are very similar, there is a very high degree of correlation between the prototype 44 and the actual physical layout design of the integrated circuit created during the back-end design stage 14. The logic design tool 40, which includes logic, placement and timing tools that perform actual estimations of timing and physical implementations of the design, is thus able to generate a prototype 44 with a high degree of confidence that the design will meet area, timing and other performance goals. For a more detailed explanation of the logic design tool 40, see the above-identified pending application which was previously incorporated by reference.

The prototype optimization tool 50 allows the logic designer to perform additional routing and placement on the prototype 44. With most designs, no additional optimization is usually necessary because the logic design tool 40 alone is sufficient in meeting the goals of the design. The sign-off prototype 24 will be the same as the prototype 44 in these situations. With aggressive designs, however, several iterations of optimization using the prototype optimization tool 50 may be necessary. For example, difficult aspects of a design can be identified and targeted for user-directed logic optimization based on timing slack graphs, congestion maps, and power analysis reports generated by the reporting tool 48. This optimization can include simple functions such as buffering and cell re-sizing as well as more complex technology re-mapping. Congested areas can be selected for area recovery and operations can be performed such as cell size reductions, buffer removal, and gate splitting. Designers also have the ability to move cells around and re-route top-level clock and power supply wires. The prototype optimization tool 50 may also include semi-automatic tools that allow the designer to select portions of the design, set cost functions, and run logic optimization or other algorithms on those portions. The physical sign-off tool 22 thus empowers logic designers to participate in defining the physical layout of integrated circuits and to achieve a level of design performance beyond what can be done using the physical design tool 26. This tool is therefore especially advantageous with aggressive designs that may require intervention by the designer to achieve convergence.

Figure 3:
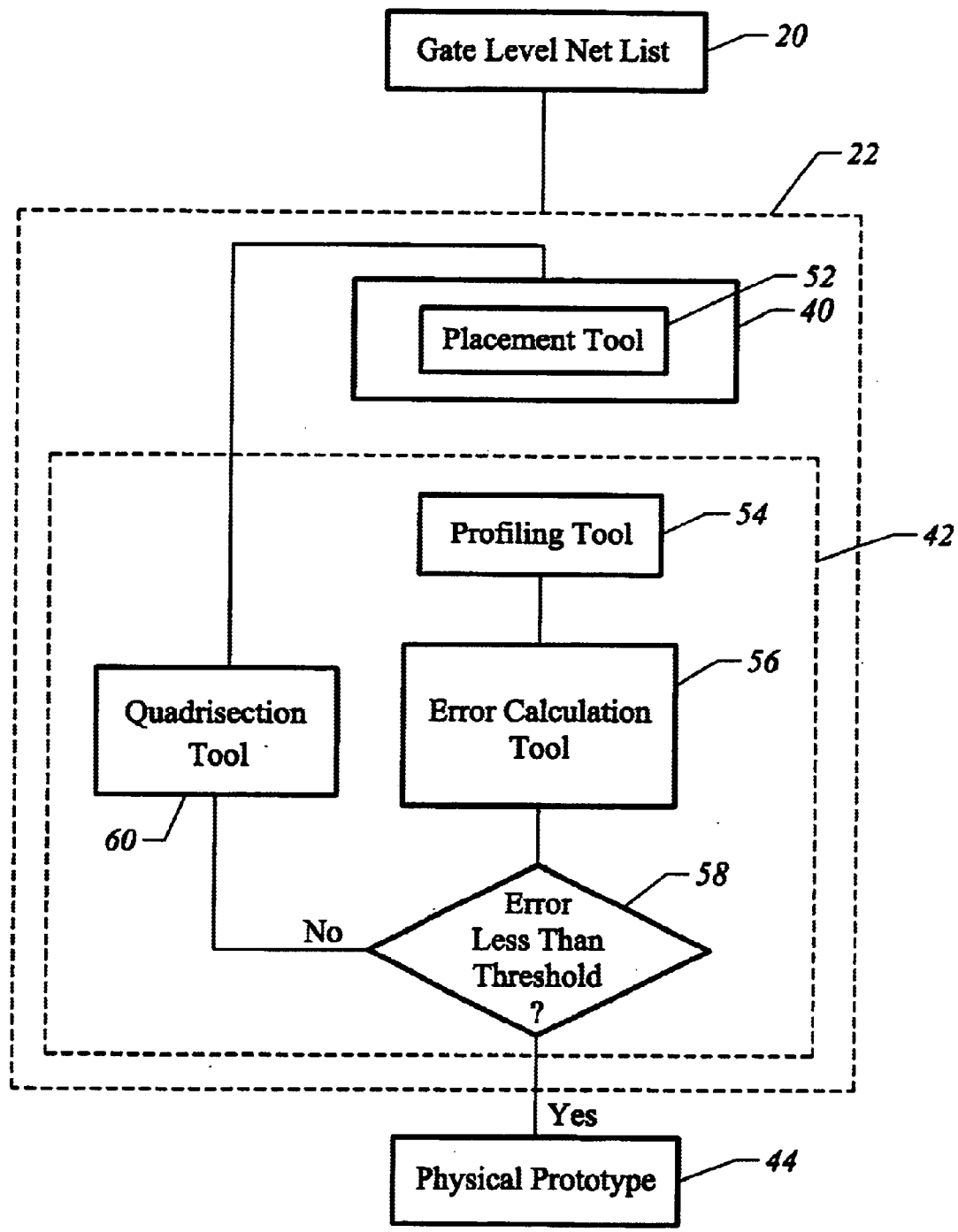
FIG. 3 is a diagram of a prototype tool included in the physical sign-off tool of the present invention.

Referring to FIG. 3, an expanded diagram detailing the prototype tool 42 is shown. The placement tool 52 of logic design tool 40 performs floor planning to localize the placement of gates in bins. The prototype tool 42 includes a profiling tool 54 to create profiles of wire lengths in each bin, an error calculation tool 56 which calculates the errors in the prediction of the timing value in each bin, a decision element 58 which determines if the errors in the prediction of the timing value for each bin is less than a predetermined threshold, and a quadrisection tool 60 which performs a quadrisection operation of the design floor plan. During operation, the logic design tool 40 receives the gate level net list 20 with its timing constraints, physical and timing libraries and technology constraints, and creates an initial floor plan of the design using the placement tool 52. Initially the entire chip floor plan is treated as one large bin, which is defined as a "bucket of cells". Once the placement is performed, the profiling tool 54 generates a wire length profile for the bin. The profile is created by initially placing the gates on top of one another in the center of the bin and then doing a fast placement of the gates within the bin. Any known placement or floor planning technique could be used. Once the fast placement is done, the gates are legally placed within the bin and the nets connecting the gates are established with wires having a finite length. The wire length profile is a histogram that plots the length of wires versus instances of net for the bin. The mean and standard deviation of the wire lengths is computed from the profile. Then the error calculation tool 56 calculates the errors in the prediction of the timing value (the "error prediction") in the bin from the mean and standard deviation of the wire lengths and from timing information in the cell library. The timing value is typically the delay of a typical stage (the path from the input of a gate, through the transistors of the gate and any interconnect wires, ending at the input of the next gate) or could be another parameter of interest to the designer. The error prediction for the bin is then compared with the predetermined threshold at the decision element 58. If the error prediction is greater than the threshold, tool 60 quadrisections the floor plan into smaller bins and the above sequence is repeated over and over for each bin until the error prediction for each bin is less than the threshold. With each quadrisection, the bins become smaller and smaller. Consequently the cell placement within the bins becomes more and more refined (i.e. progressively finer granularity) and the ability to predict wire delays becomes more and more accurate. Eventually the length and delay of all the wires of the design can be predicted with a high degree of certainty and the error prediction for each of the bins will become very small. When the error prediction for all of the bins is less than the threshold, the above sequence stops, a hard interrupt occurs, and the logic designer is presented with prototype 44. As noted above, the designer may or may not perform additional optimization using tool 50 on the prototype 44 to generate the sign-off prototype 24. The physical sign-off tool 22 thus addresses the challenge of designing with sub-micron processes by integrating logic and physical optimization into a single tool that can significantly reduce or even eliminate design iterations previously caused by inaccurate estimations of performance and area. Logic designers can therefore confidently optimize their design without the actual iterations of physical place and route.

The above described process for dynamically profiling of wire lengths within bins is useful for predicting wire lengths and delays not only for wires within a bin but also for wires between bins (e.g. "long wires"). With accurate delay estimate information, a designer can readily identify problems and then correct them using the prototype optimization tool 50 as previously described. With long wires that route across multiple bins, the only uncertainty of the length of the wire is at its end points (location of each end point within its bin). Consequently as the uncertainty of the wire lengths within the bins becomes smaller and smaller after each quadrisection, the ability to predict the length of the long wires becomes more and more accurate. Eventually after multiple iterations of quadrisection, accurate delays for most long wires are obtained. Then a logic designer can identify and correct timing problems associated with long wires using the reporting tool 48 and prototype optimization tool 50 as described above. This is advantageous particularly with deep sub-micron designs because wire delays are becoming a bigger and bigger proportion of the total delay in an integrated circuit design. Furthermore as designs become more aggressive, it will become increasingly more difficult for physical design tools to generate acceptable GDS files. Since the physical sign-off tool 22 allows the designer to interactively correct problems at the prototype level, many of the problems of generating acceptable GDS files can be avoided. The physical signl-off tool 22 thus is capable of simplifying the back-end physical layout of a design.

The quadrisection sequence is best illustrated using several examples. Referring to FIGS. 4A–4C, an integrated circuit at various stages of quadrisection is shown. In FIG. 4A, the integrated circuit 70 is shown prior to quadrisection. Initially the entire integrated circuit is treated as one large bin. In FIG. 4B, the integrated circuit 70 has been subjected to several iterations of quadrisection resulting in a plurality of bins 72 of medium size. In FIG. 4C, the integrated circuit is shown after numerous iterations of quadrisection resulting in a plurality of small bins 74. Referring to FIG. 5A–5C, three wire length profiles corresponding to the bins illustrated in FIGS. 4A–4C respectively are shown. In FIG. 5A, the wire length profile is substantially flat because the bin is so large. In FIG. 5B, the profile has narrowed because the bins are smaller and the wire lengths within each bin are smaller. Finally in FIG. 5C, the profile is very narrow because the bin size is very small and the wire lengths within the bin are also very short. The error in the prediction of the timing value is therefore less than the predetermined threshold.

The predetermined threshold is set in accordance with one embodiment of the invention at a point where statistically all the wire delays in the design, both between cells and within cells, do not impact the design and performance of the integrated circuit. Thus when the prototype tool 42 has the ability to predict with a high degree of certainty that all of the wire delays in the design are less than the threshold, additional placement and optimization by the logic design tool 40 is no longer necessary and the prototype 44 is generated. Since the threshold value is set by the designer, it can be set in accordance with other parameters, such as congestion, power, and heat distribution. In yet another embodiment, different portions of a chip design may be assigned to different predetermined thresholds. For example, a lower threshold may be assigned to an extremely dense portion and a higher threshold may be assigned to a less complex portion of the chip.

In addition to providing a logic designer with the ability to optimize a design, the physical sign-off tool 22 is also useful for facilitating the physical design of an integrated circuit by back-end designers. In the electronics industry, chip design is often a collaborative effort between companies. The front-end logic design stage 12 is typically performed by logic design specialists at a system vendor. The back-end physical design stage 14 is performed by physical design specialists at an ASIC vendor company or a semiconductor fabrication company. This division of labor has not previously worked very well with deep sub-micron integrated circuit designs. As mentioned above, logic designers using prior art synthesis tools will often generate sub-optimal net lists. The back-end physical designers as a consequence may be unable to converge on a physical design as a result. This problem is exasperated in situations where the logic designer and the physical designer are located at different companies, do not have the ability to conveniently work together, and may be using incompatible tools.

Figure 6:
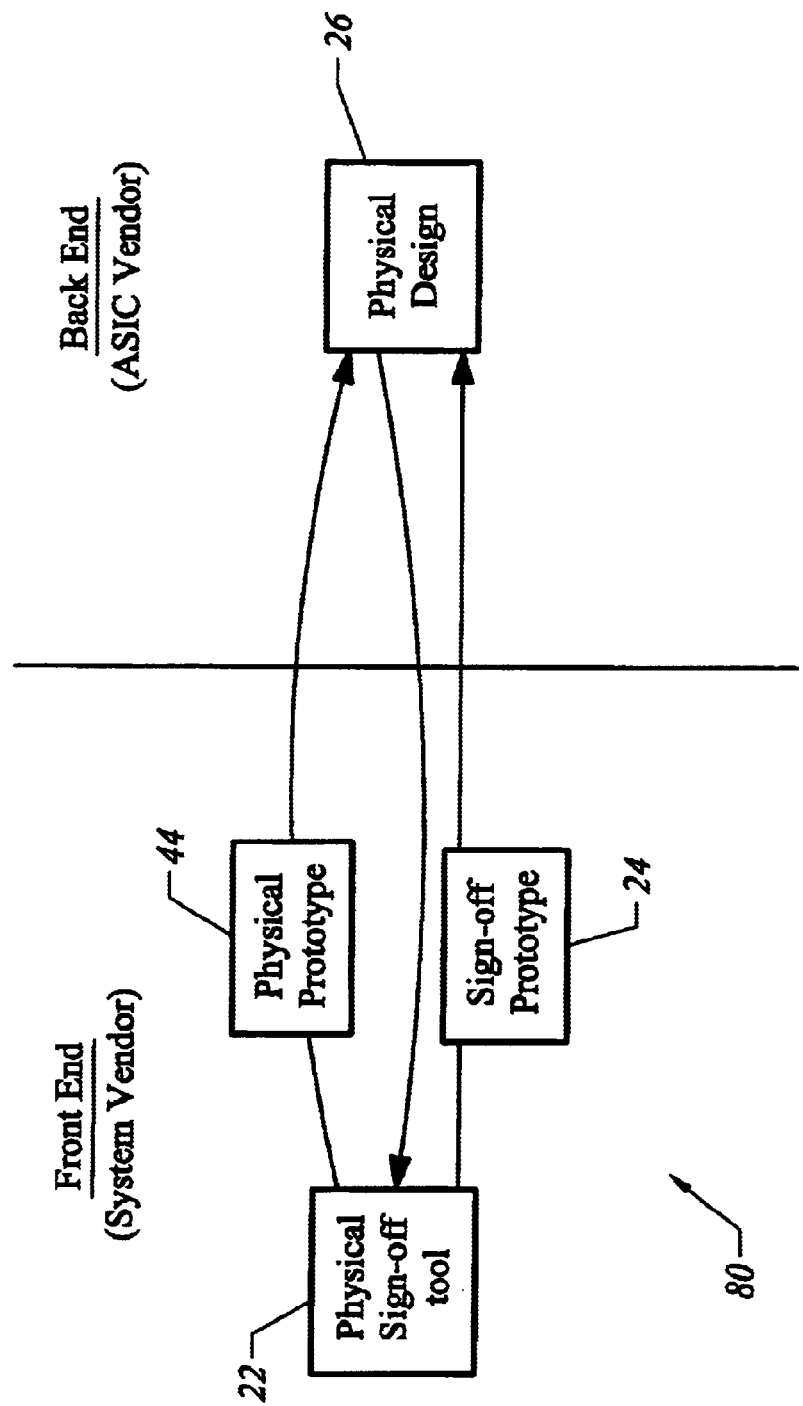
FIG. 6 is a diagram illustrating how the present invention enables front-end logic designers and back-end physical designers to collaborate on integrated circuit designs.

Referring to FIG. 6, a diagram illustrating how the present invention enables front-end logic designers and back-end physical layout designers to collaborate on integrated circuit designs is shown. The diagram 80 shows the physical sign-off tool 22 located at a system vendor and the physical design tool 26 located at an ASIC vendor. If the logic designer is having difficulty making the design converge, the physical prototype 44 can be sent to the ASIC vendor for expert analysis by a back-end physical layout designer. The physical designer can identify problems and ask the logic designer to perform additional optimization using the prototype optimization tool 50 or, in more difficult cases, to change the RTL to modify the physical prototype 44. Since the logic design tool 40 contains similar tools as the physical design tool 26 and the prototype optimization tool 50 allows a logic designer to fix problems at a prototype level, the logic designer can readily collaborate with the physical designer to fix problems so the design can quickly arrive at convergence. When the logic designer finishes generating the sign-off prototype 24, it is sent to the ASIC vendor so that a back-end designer can perform the physical layout. The physical sign-off tool 22 thus provides logic designers with the ability to help the physical designers generate GDS files for aggressive designs without having a high degree of expertise in the art of physical design.

The above-discussed sequence was described in relation to the design of an entire integrated circuit chip. It should be noted that this design sequence can also be applied to selected blocks on a chip. This feature is useful because an entire chip is often not designed from scratch. With many integrated circuits, blocks of the chip are copied and "pasted" into the design from previous chips. Since presumably these blocks have already been optimized, it may make sense to use the design sequence of the present invention just on the new or selected portions of the chip as opposed to the entire chip.

Figure 7:
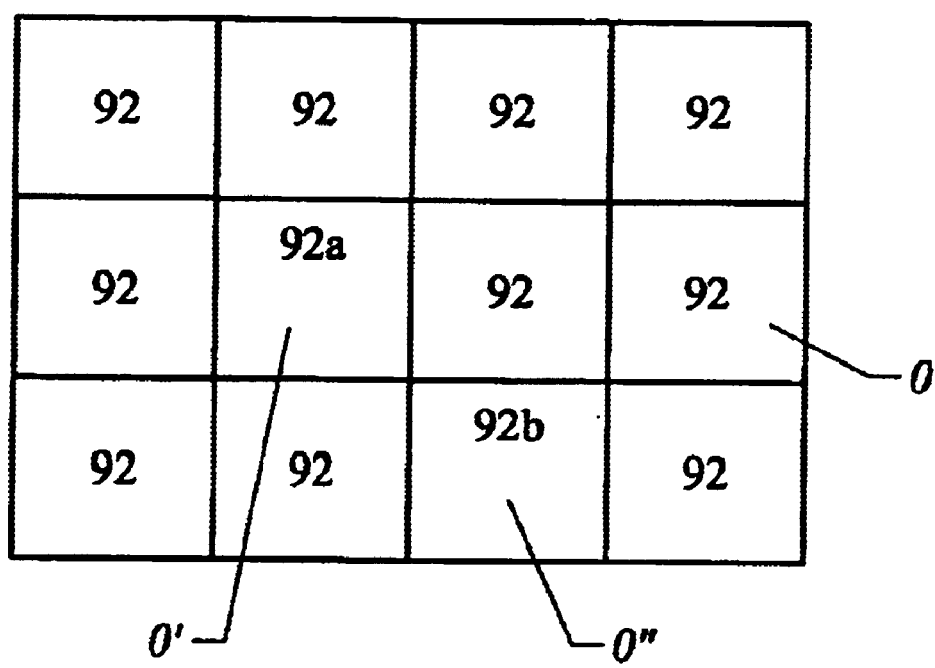
FIG. 7 is a diagram that illustrates an integrated circuit that has been designed and fabricated according to the present invention.

Referring to FIG. 7, a diagram that illustrates an integrated circuit that has been designed and fabricated according to the present invention is shown. The integrated circuit 90 includes a plurality of bins 92. Assuming in this example that the prototype optimization tool 50 was used with certain bins (i.e., bin 92a and 92b), the optimization criteria for both of these bins is different than the other bins where optimization was not needed. In other words, the bins 92 are designed to a criterion of O, the bin 92a was designed to a criterion of O' and the bin 92b was designed to yet another criterion of O". Since each optimization criterion is different, one or more nets in the bins 92, 92a and 92b are therefore optimized to different criteria respectively.

Figure 8:
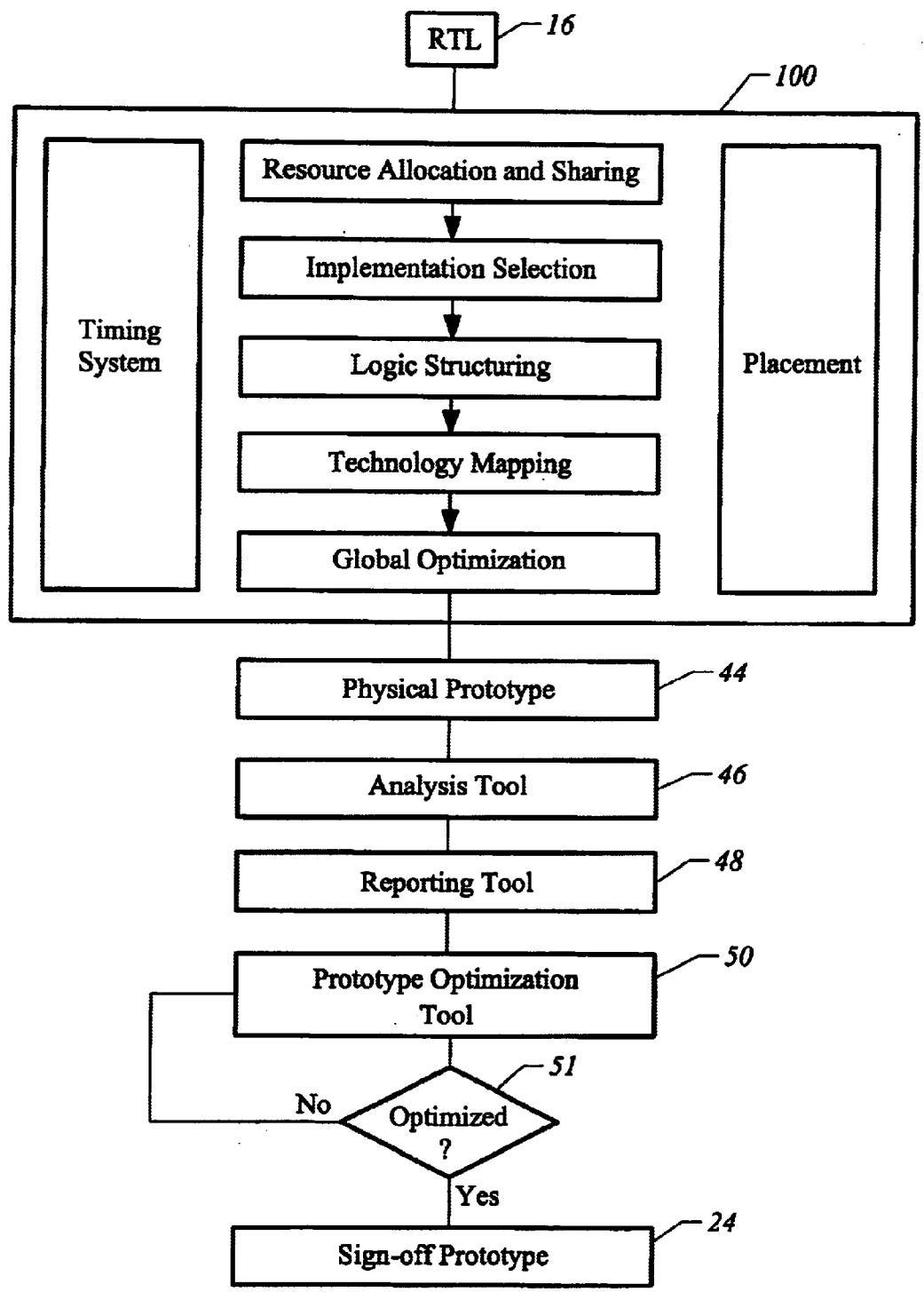
FIG. 8 is an alternative embodiment of the present invention.

Referring to FIG. 8, an alternative embodiment of the present invention is shown. With this embodiment, the design sequence as described in relation to FIG. 1 and FIG. 2 above is essentially the same except a different logic design tool 100 is used in place of the logic design tool 40. The logic design tool 100 includes: (a) a resource allocation and sharing tool which allocates register units (memory elements) and functional units (such as adders, multipliers and subtractors) and the share units for certain operations when these operations are mutually exclusive in time; (b) an implementation selection tool which decides on the type of adder to be used for the functional unit performing the addition operation, the type of multiplier for the multiplication operation, and so on; (c) a logic structuring tool which restructures logic gate networks to optimize for area and timing; (d) a technology mapping tool which maps gates to technology library elements; and (e) a global optimization tool which optimizes the gates for timing, area, and other design constraints. Timing and placement capabilities are integrated with each of these tools (a through e). During operation, these tools (a through e) are sequentially used to generate a physical prototype 44 that includes estimations of timing and physical implementations of a design. Since elements 16, 24 and 46–51 perform the same or a similar function as described above, a detailed description of these elements is not provided herein for the sake of brevity.

Figure 9:
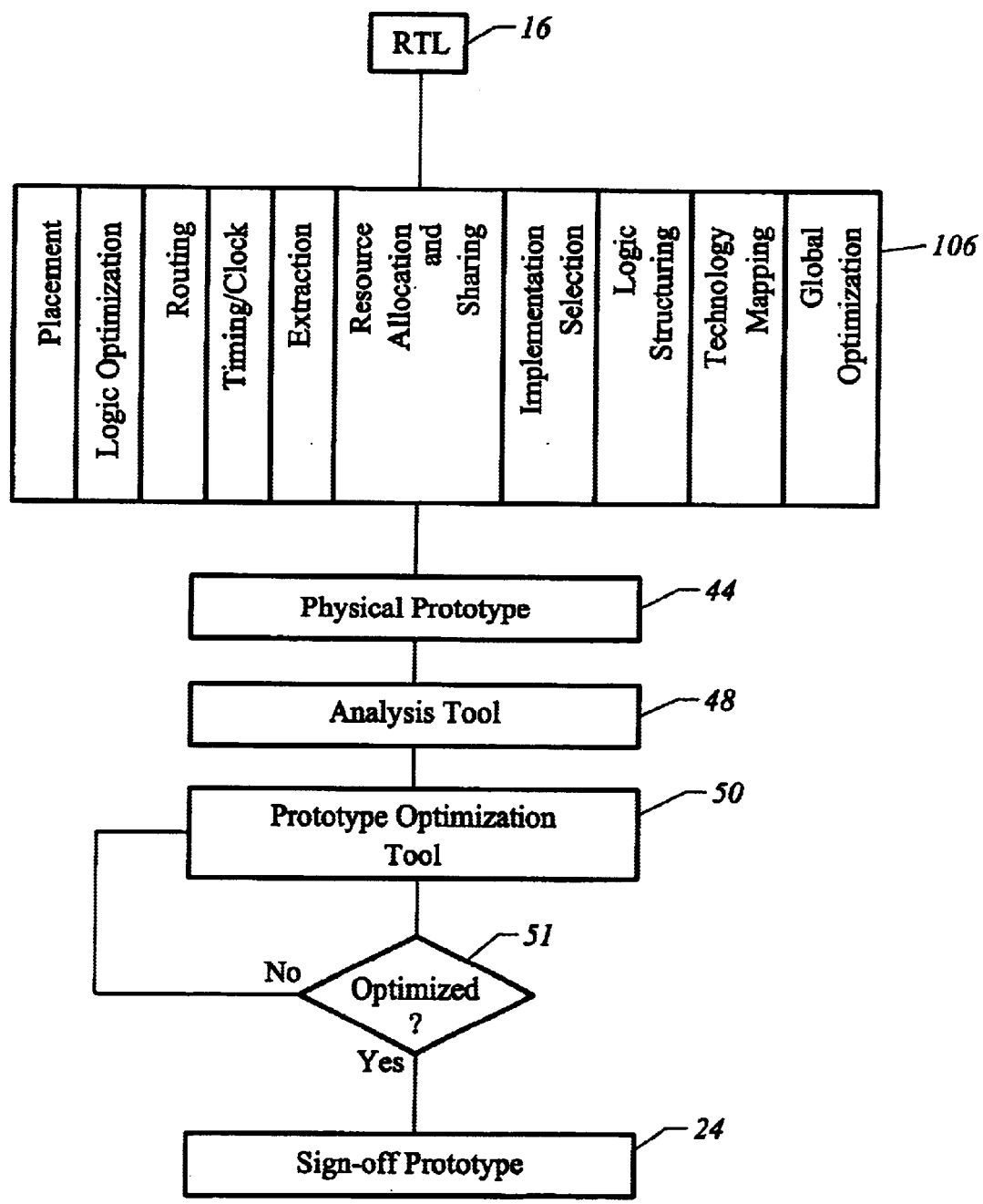
FIG. 9 is yet another alternative embodiment of the present invention.

Referring to FIG. 9, yet another alternative embodiment of the present invention is shown. With this embodiment, the design sequence as described in relation to FIGS. 1, 2 and 8 is essentially the same except the logic design tool 40 and the logic design tool 100 are combined into another logic design tool 106 and the individual tools within each are designed to work in parallel. These tools are used to generate a physical prototype 44. These tools are combined by using the optimization capability of all these tools so the capabilities of each are utilized at the appropriate times during placement. Again since elements 16, 24 and 46–51 perform the same or a similar function as described above, a detailed description of these elements is not provided herein for the sake of brevity.

Embodiments include a computer-readable medium including computer code configured to perform the design of an integrated circuit, the computer code configures to effectuate the following: defining a physical design of the circuit while tracking an error in prediction of a timing value associated with one or more nets in the circuit; and determining a physical placement level of the circuit when the error in prediction of the timing value satisfies a predetermined threshold. A computer system configured to perform the design of an integrated circuit, the computer system comprising: a physical design module configured to define a physical design of the circuit while tracking an error in prediction of a timing value associated with one or more nets in the circuit; and a physical placement level module configured to determine a physical placement level of the circuit when the error in prediction of the timing value satisfies a predetermined threshold.

Although only a few embodiments of the present invention have been described, it should be understood that the present invention may be embodied in many other specific forms without departing from the spirit or the scope of the invention. Therefore, the present examples are to be considered as illustrative and not restrictive, and the invention is not to be limited to the details given herein, but may be modified within the scope of the appended claims.

What is claimed is:

1. A method for a first party to fabricate a semiconductor device, comprising:
   receiving a sign-off prototype, the sign-off prototype generated by:
      defining a physical design of a circuit while tracking an error in prediction of a timing value associated with one or more nets in the circuit;
      determining a physical placement level of the circuit when the error in prediction of the timing value satisfies a predetermined threshold; and
      generating the sign-off prototype from the physical placement level of the circuit when the error in prediction of the timing value satisfies a predetermined threshold wherein generating said sign-off prototype is performed without using a physical design tool; and after receiving the sign-off prototype, the first party performing:
  generating a second physical design of the circuit from the sign-off prototype;
  generating a GDS file from the second physical design;
  having a mask set generated from the GDS file; and
  having the semiconductor device fabricated using the mask set.

2. The method of claim 1, wherein generating the second physical design of the circuit further comprises performing one or more of the following: placement of cells of the design, logic optimization of the design, routing of wires in the design, timing and clock control for the design and extraction of the design.

3. The method of claim 2, wherein the performing the placement of cells of the design, logic optimization of the design, routing of wires in the design, timing and clock control for the design and extraction of the design occurs substantially in parallel using a physical design tool.

4. The method of claim 1, wherein the receiving the sign-off prototype further comprises receiving the sign-off prototype from a second party.

5. The method of claim 4, wherein generating the second physical design of the circuit from the sign-off prototype further comprises having the second party to perform additional interactive optimization on the sign-off prototype after receiving the sign-off prototype so the second party can collaborate in resolving problems identified in the sign-off prototype.

6. The method of claim 1, wherein the determining the physical placement level of the circuit when the error in prediction of the timing value satisfies a predetermined threshold further comprises:
  (a) quadrisectioning the physical design into bins;
  (b) localizing placement of cells and wires of the physical design into the bins;
  (c) creating a profile of the wire lengths in each of the bins;
  (d) calculating a plurality of errors in a prediction of timing values from the profile of the wire lengths for each bin respectively;
  (e), comparing each of the plurality of errors in the prediction of the timing values with the predetermined threshold to determine if the timing value satisfies the predetermined threshold; and either:
    further quadrisectioning the physical design and repeating (b through e); or
    generating an interrupt if all of the plurality of errors in the prediction of the timing values for each of the bins satisfy the predetermined threshold.

7. A semiconductor device manufactured by a first party by:
  receiving a sign-off prototype, the sign-off prototype generated by:
    defining a physical design of a circuit while tracking an error in prediction of a timing value associated with one or more nets in the circuit;
    determining a physical placement level of the circuit when the error in prediction of the timing value satisfies a predetermined threshold; and
    generating the sign-off prototype from the physical placement level of the circuit when the error in prediction of the timing value satisfies a predetermined threshold wherein generating said sign-off prototype is performed without using a physical design tool; and after receiving the sign-off prototype, the first party performing:
    generating a second physical design of the circuit from the sign-off prototype,
    generating a GDS file from the second physical design;
    having a mask set generated from the GDS file, and
    having the semiconductor device fabricated using the mask set.

8. The semiconductor device of claim 7, wherein generating the second physical design of the circuit further comprises performing one or more of the following: placement of cells of the design, logic optimization of the design, routing of wires in the design, timing and clock control for the design and extraction of the design.

9. The semiconductor device of claim 8, wherein the performing the placement of cells of the design, logic optimization of the design, routing of wires in the design, timing and clock control for the design and extraction of the design occurs substantially in parallel using a physical design tool.

10. The semiconductor device of claim 7, wherein the determining the physical placement level of the circuit when the error in prediction of the timing value satisfies a predetermined threshold further comprises:
  (a) quadrisectioning the physical design into bins;
  (b) localizing placement of cells and wires of the physical design into the bins;
  (c) creating a profile of the wire lengths in each of the bins;
  (d) calculating a plurality of errors in a prediction of timing values from the profile of the wire lengths for each bin respectively;
  (e) comparing each of the plurality of errors in the prediction of the timing values with the predetermined threshold to determine if the timing value satisfies the predetermined threshold; and either:
    further quadrisectioning the physical design and repeating (b through e); or
    generating an interrupt if all of the plurality of errors in the prediction of the timing values for each of the bins satisfy the predetermined threshold.

11. The semiconductor device of claim 7, wherein the receiving the sign-off prototype further comprises receiving the sign-off prototype from a second party.

12. The semiconductor device of claim 11, wherein generating the second physical design of the circuit from the sign-off prototype further comprises performing additional interactive optimization on the sign-off prototype after receiving the sign-off prototype so the second party can collaborate in resolving problems identified in the sign-off prototype.

13. A method of performing a design of a circuit, comprising:
  accessing a gate level design for said circuit;
  creating a physical prototype from said gate level design, said creating of a physical prototype includes predicting of timing for said circuit and tracking an error in said predicting of timing wherein creating said physical prototype is performed without using a physical design tool; and
  creating a physical design for said circuit, said creating of said physical design includes placing and routing elements of said circuit, said creating of a physical prototype is performed prior to said creating of said physical design.

14. A method according to claim 13, wherein:
said step of creating a physical design is performed using a physical design tool.

15. A method according to claim 13, wherein said creating of said physical prototype comprises:
localizing placement of cells and wires;
creating a profile of wire lengths;
calculating an error in a prediction of a timing value from said profile of said wire lengths;
comparing said error in said prediction with a predetermined threshold; and
performing further placement if said error does not satisfy said predetermined threshold.

16. A method according to claim 13, wherein said creating of said physical prototype comprises:
defining a representation of said circuit based on said gate level design;
quadrisectioning said representation into bins;
localizing placement of cells and wires of said representation into said bins;
creating a profile of wire lengths in each of said bins;
calculating a plurality of errors in a prediction of timing values from said profile of said wire lengths for each bin respectively;
comparing each of said plurality of errors in said prediction of said timing values with a predetermined threshold; and
if said error does not satisfy said predetermined threshold, further quadrisectioning said representation and repeating said steps of localizing, creating, calculating and comparing.

17. A method according to claim 13, wherein said creating of said physical prototype further comprises analyzing congestion and power for said physical prototype.

18. A method according to claim 13, further comprising:
generating a GDS file from said physical design.

19. A method according to claim 13, further comprising:
generating a GDS file from said physical design;
having a mask set generated from the GDS file; and
having the semiconductor device fabricated using the mask set.

20. A method of performing a design of a circuit, comprising:
accessing a gate level design for said circuit;
creating a physical prototype from said gate level design, said creating of a physical prototype includes predicting of timing for said circuit wherein creating said physical prototype is performed without using a physical design tool; and
providing said physical prototype for a physical design process so that a physical design can be created for said circuit including placing and routing elements of said circuit, said creating of a physical prototype is performed prior to said step of providing.

21. A method according to claim 20, wherein:
said step of providing includes providing said physical prototype to a physical design tool.

22. A method according to claim 20, wherein said creating of said physical prototype comprises:
localizing placement of cells and wires;
creating a profile of wire lengths;
calculating an error in a prediction of a timing value from said profile of said wire lengths;
comparing said error in said prediction with a predetermined threshold; and
performing further placement if said error does not satisfy said predetermined threshold.

23. A method according to claim 20, wherein said creating of said physical prototype comprises:
defining a representation of said circuit based on said gate level design;
quadrisectioning said representation into bins;
localizing placement of cells and wires of said representation into said bins;
creating a profile of wire lengths in each of said bins;
calculating a plurality of errors in a prediction of timing values from said profile of said wire lengths for each bin respectively;
comparing each of said plurality of errors in said prediction of said timing values with a predetermined threshold; and
if said error does not satisfy said predetermined threshold, further quadrisectioning said representation and repeating said steps of localizing, creating, calculating and comparing.

24. A method according to claim 20, wherein said creating of said physical prototype further comprises analyzing congestion and power for said physical prototype.

25. A computer-readable medium including computer code configured to perform the design of an integrated circuit, the computer code configures to perform a method comprising:
accessing a gate level design for said circuit;
creating a physical prototype from said gate level design, said creating of a physical prototype includes predicting of timing for said circuit wherein creating said physical prototype is performed without using a physical design tool; and
providing said physical prototype for a physical design process so that a physical design can be created for said circuit including placing and routing elements of said circuit, said creating of a physical prototype is performed prior to said step of providing.

26. A computer-readable medium according to claim 25, wherein:
said step of providing includes providing said physical prototype to a physical design tool.

27. A computer-readable medium according to claim 25, wherein said creating of said physical prototype comprises:
localizing placement of cells and wires;
creating a profile of wire lengths;
calculating an error in a prediction of a timing value from said profile of said wire lengths;
comparing said error in said prediction with a predetermined threshold; and
performing further placement if said error does not satisfy said predetermined threshold.

28. A computer-readable medium according to claim 25, wherein said creating of said physical prototype comprises:
defining a representation of said circuit based on said gate level design;
quadrisectioning said representation into bins;
localizing placement of cells and wires of said representation into said bins;

creating a profile of wire lengths in each of said bins;

calculating a plurality of errors in a prediction of timing values from said profile of said wire lengths for each bin respectively;

comparing each of said plurality of errors in said prediction of said timing values with a predetermined threshold; and if said error does not satisfy said predetermined threshold, further quadrisectioning said representation and repeating said steps of localizing, creating, calculating and comparing.

29. A computer-readable medium according to claim 25, wherein said creating of said physical prototype further comprises analyzing congestion and power for said physical prototype.

30. A computer system configured to perform the design of a circuit, the computer system comprising:

means for accessing a gate level design for said circuit;

means for creating a physical prototype from said gate level design, said creating of a physical prototype includes predicting of timing for said circuit wherein creating said physical prototype is performed without using a physical design tool; and means for providing said physical prototype for a physical design process so that a physical design can be created for said circuit including placing and routing elements of said circuit, said creating of a physical prototype is performed prior to said step of providing.

31. A computer system according to claim 30, wherein:

said means for providing includes providing said physical prototype to a physical design tool.

32. A computer system according to claim 30, wherein said means for creating of said physical prototype comprises:

means for localizing placement of cells and wires;

means for creating a profile of wire lengths;

means for calculating an error in a prediction of a timing value from said profile of said wire lengths;

means for comparing said error in said prediction with a predetermined threshold; and means for performing farther placement if said error does not satisfy said predetermined threshold.

33. A computer system according to claim 30 wherein said means for creating of said physical prototype comprises:

means for defining a representation of said circuit based on said gate level design;

means for quadrisectioning said representation into bins;

means for localizing placement of cells and wires of said representation into said bins;

means for creating a profile of wire lengths in each of said bins;

means for calculating a plurality of errors in a prediction of timing values from said profile of said wire lengths for each bin respectively;

means for comparing each of said plurality of errors in said prediction of said timing values with a predetermined threshold; and means for, if said error does not satisfy said predetermined threshold, further quadrisectioning said representation and repeating said steps of localizing, creating, calculating and comparing.

34. A computer system according to claim 30, wherein said means for creating of said physical prototype further comprises means for analyzing congestion and power for said physical prototype.

* * * * *